(12) United States Patent
Chan et al.

(10) Patent No.: US 9,399,336 B2
(45) Date of Patent: Jul. 26, 2016

(54) GAS BARRIER SUBSTRATE

(71) Applicant: E Ink Holdings Inc., Hsinchu (TW)

(72) Inventors: Lih-Hsiung Chan, Hsinchu (TW);
Huai-Cheng Lin, Hsinchu (TW);
Chih-Cheng Wang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 12 days.

(21) Appl. No.: 13/831,988

(22) Filed: Mar. 15, 2013

(65) Prior Publication Data
US 2014/0030494 A1    Jan. 30, 2014

(30) Foreign Application Priority Data
Jul. 25, 2012 (TW) .............................. 101126795 A

(51) Int. Cl.
*B32B 9/04* (2006.01)
*B32B 17/06* (2006.01)
*H01L 27/12* (2006.01)
*G02F 1/1333* (2006.01)

(52) U.S. Cl.
CPC . *B32B 9/04* (2013.01); *B32B 17/06* (2013.01); *G02F 1/133305* (2013.01); *G02F 2001/133311* (2013.01); *H01L 27/1218* (2013.01); *Y10T 428/2495* (2015.01); *Y10T 428/24942* (2015.01); *Y10T 428/24992* (2015.01)

(58) Field of Classification Search
CPC .. B32B 9/041; B32B 17/061; B32B 17/10798
See application file for complete search history.

(56) References Cited

U.S. PATENT DOCUMENTS

| | | | |
|---|---|---|---|
| 5,085,904 A * | 2/1992 | Deak et al. | 428/446 |
| 5,168,541 A * | 12/1992 | Booth | G02B 6/122 428/458 |
| 7,492,091 B2 * | 2/2009 | Kharrazi-Olsson et al. | 428/689 |
| 7,671,364 B2 | 3/2010 | Lee et al. | |
| 2001/0038894 A1* | 11/2001 | Komada | 428/34.6 |
| 2004/0052975 A1* | 3/2004 | Komada et al. | 428/1.51 |
| 2004/0253451 A1* | 12/2004 | Kawashima | C23C 16/30 428/411.1 |
| 2005/0109606 A1* | 5/2005 | He et al. | 204/192.14 |
| 2011/0217533 A1 | 9/2011 | Nishida | |

(Continued)

FOREIGN PATENT DOCUMENTS

| | | |
|---|---|---|
| CN | 1899815 | 1/2007 |
| JP | 2009031612 | 2/2009 |
| TW | 201143503 | 12/2011 |

OTHER PUBLICATIONS

[NPL-1] "Silicon Monoxide (10097-28-6)". Chemical Book (Aug. 4, 2014); <http://www.chemicalbook.com/ProductMSDSDetailCB0278818_EN.htm>.*

(Continued)

*Primary Examiner* — David Sample
*Assistant Examiner* — Donald M Flores, Jr.
(74) *Attorney, Agent, or Firm* — Jianq Chyun IP Office

(57) ABSTRACT

A gas barrier substrate including a flexible base material, at least one first inorganic gas barrier layer and at least one second inorganic gas barrier layer is provided. The flexible base material has an upper surface. The first inorganic gas barrier layer is disposed on the flexible base material and covers the upper surface. The second inorganic gas barrier layer is disposed on the first inorganic gas barrier layer and covers the first inorganic gas barrier layer. A water vapor and oxygen transmission rate of the second inorganic gas barrier layer is lower than that of the first inorganic gas barrier layer.

9 Claims, 2 Drawing Sheets

(56) References Cited

U.S. PATENT DOCUMENTS

2012/0034451 A1* 2/2012 Seo et al. ............... 428/332
2012/0107586 A1* 5/2012 Yu et al. ............... 428/216

OTHER PUBLICATIONS

[NPL-2] "Silicon Dioxide (14808-60-7)". Chemical Book (Nov. 8, 2014); <http://www.chemicalbook.com/ProductMSDSDetailCB9154858_EN.htm>.*

A.S. da Silva Sobrinho, G. Czeremuszkin, M. Latrèche, and M. R. Wertheimer; "Defect-permeation correlation for ultrathin transparent barrier coatings of polymers". J. Vac. Sci. Technol. A, vol. 18, No. 1, Jan./Feb. 2000; p. 149-157.*

A.S. da Silva Sobrinho, M. Latrèche, G. Czeremuszkin, J. E. Klemberg-Sapieha, and M. R. Wertheimer; "Transparent barrier coatings on polyethylene terephthalate by single- and dual-frequency plasma-enhanced chemical vapor deposition". J. Vac. Sci. Technol. A, vol. 16, No. 6, Nov./Dec. 1998; p. 3190-3198.*

"Office Action of Taiwan Counterpart Application", issued on Feb. 20, 2013, p. 1-p. 5, in which the listed references were cited.

"Office Action of China Counterpart Application", issued on Jul. 16, 2015, p. 1-p. 7, in which the listed references were cited.

D.S. Wuu et al., "Water and Oxygen Permeation of Silicon Nitride Films Prepared by Plasma-Enhanced Chemical Vapor Deposition", Surface & Coatings Technology 198 (2005) 114-117, Available Online Nov. 18, 2004.

* cited by examiner

GAS BARRIER SUBSTRATE

CROSS-REFERENCE TO RELATED APPLICATION

This application claims the priority benefit of Taiwan application serial no. 101126795, filed on Jul. 25, 2012. The entirety of the above-mentioned patent application is hereby incorporated by reference herein and made a part of this specification.

BACKGROUND

1. Field of the Invention

The invention relates to a gas barrier substrate, and more particularly to, a gas barrier substrate with favorable gas barrier capability.

2. Description of Related Art

A base material of a display device determines whether the display device posses a flexibility. When a substrate of the display device is a rigid substrate, such as a glass substrate, the display device does not posses the flexibility. Contrarily, when the substrate of the display device is a flexible substrate, such as a plastic substrate, the display device is then possessed with a favorable flexibility.

Advantages of the flexible substrate, in comparative to the general rigid substrate, are cheap, transparent, easy processing, compliance with safety, suitable for all display medias, and suitable for a Roll-to-Roll process, but disadvantages thereof are high temperature intolerance, poor water and oxygen resistance, poor chemical resistance, and large thermal expansion coefficient. A penetration rate of the typical flexible substrate is 100 to $10^{-1}$ g/m$^2$/day (25° C.). Because the typical flexible substrate cannot block the penetration of water vapor and oxygen completely, the aging of elements within the substrate is accelerated, causing the life-span of the produced elements to cut short, and is thereby unable to meet the business demands. Therefore, in order to block water and oxygen, a special material for densification is coated between the flexible substrate and an inorganic conductive layer to prevent the penetration and the diffusion of water and oxygen. The selection of this densification barrier material requires it to be capable of defect freely and evenly forming a film layer during a coating process, not producing pinholes, having high light transmittance, and avoiding absorption of visible light; and the densification barrier material achieves the gas barrier requirements of the flexible substrate with an arrangement of single layer or multilayer stacking.

Currently, a soft gas barrier film layer formed on the flexible substrate includes an organic film layer and an inorganic film layer, the inorganic film layer is, for example, a metal oxide, a metal nitride, a metal oxynitride, and the likes, wherein the gas resistance of the inorganic film layer is better than that of the organic film layer, and the organic film layer may maintain the softness of the overall gas barrier film layer. However, if a thickness of the inorganic film layer is increased to enhance the characteristic of blocking water and oxygen, the excessively thick inorganic film layer would be easily prone to produce a crack during bending, and thus an avoidance of a gas barrier film layer failure caused by a stress concentration has become important.

SUMMARY OF THE INVENTION

The invention provides a gas barrier substrate with favorable gas barrier capability.

The invention provides a gas barrier substrate including a flexible base material, at least one first inorganic gas barrier layer and at least one second inorganic gas barrier layer. The flexible base material has an upper surface. The first inorganic gas barrier layer is disposed on the flexible base material and covers the upper surface. The second inorganic gas barrier layer is disposed on the first inorganic gas barrier layer and covers the first inorganic gas barrier layer, wherein a water vapor and oxygen transmission rate (WVTR) of the second inorganic gas barrier layer is lower than a water vapor and oxygen transmission rate of the first inorganic gas barrier layer.

In an embodiment of the invention, the flexible base material includes a plastic base material or a thinning glass base material.

In an embodiment of the invention, a material of the first inorganic gas barrier layer includes silicon nitride or silicon oxide.

In an embodiment of the invention, the material of the first inorganic gas barrier layer is the same as the material of the second inorganic gas barrier layer.

In an embodiment of the invention, a thickness of the first inorganic gas barrier layer is greater than a thickness of the second inorganic gas barrier layer.

In an embodiment of the invention, a densification of the second inorganic gas barrier layer is higher than a densification of the first inorganic gas barrier layer.

In an embodiment of the invention, a stress value of the first inorganic gas barrier layer is smaller than a stress value of the second inorganic gas barrier layer.

In an embodiment of the invention, the stress value of the first inorganic gas barrier layer is ranged between −100 MPa to 200 MPa.

In an embodiment of the invention, the stress value of the second inorganic gas barrier layer is ranged between −300 MPa to −700 MPa.

In an embodiment of the invention, the water vapor transmission rate of the first inorganic gas barrier layer is ranged between 0.1 g/m$^2$/day to 1 g/m$^2$/day and the oxygen transmission rate of the first inorganic gas barrier layer is ranged between 0.1 cc/m$^2$/day·atm to 1 cc/m$^2$/day·atm.

In an embodiment of the invention, the water vapor and oxygen transmission rate of the second inorganic gas barrier layer is ranged between 0.1 g/m$^2$/day to 0.01 g/m$^2$/day and the oxygen transmission rate of the second inorganic gas barrier layer is ranged between 0.1 cc/m$^2$/day·atm to 0.01 cc/m$^2$/day·atm.

In an embodiment of the invention, the gas barrier substrate further includes an adhesive layer disposed on the second inorganic gas barrier layer and covering the second inorganic gas barrier layer.

In an embodiment of the invention, the at least one first inorganic gas barrier layer is a plurality of first inorganic gas barrier layers, and the first inorganic gas barrier layers are alternatively stacked with the second inorganic gas barrier layer on the flexible base material.

According to the foregoing, since there are the first inorganic gas barrier layer and the second inorganic gas barrier layer, with the different water vapor and oxygen transmission rates, disposed the flexible base material, the structure of the gas barrier layer in the embodiment of the invention, in addition to having a favorable water vapor and oxygen barrier capability, may also have a flexibility.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
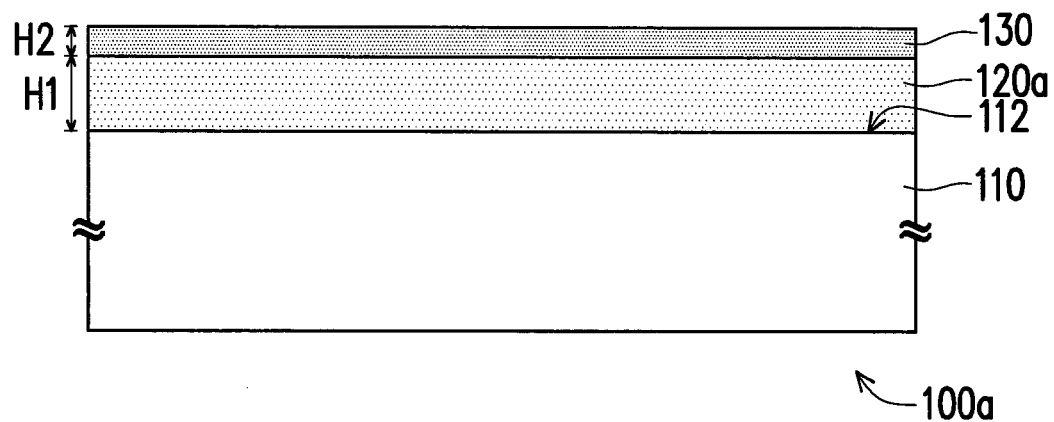
FIG. 1 is a schematic cross-sectional view illustrating a gas barrier substrate according to an embodiment.

FIG. 1 is a schematic cross-sectional view illustrating a gas barrier substrate according to an embodiment. Referring to FIG. 1, in the present embodiment, a gas barrier substrate 100a includes a flexible base material 110, at least one first inorganic gas barrier layer 120a (only one layer is schematically illustrated in FIG. 1A) and at least one second inorganic gas barrier layer 130 (only one layer is schematically illustrated in FIG. 1A).

Specifically, the flexible base material 110 has an upper surface 112, wherein the flexible base material 110 is, for example, a plastic base material or a thinning glass base material. The first inorganic gas barrier layer 120a is disposed on the flexible base material 110 and covers the upper surface 112. The second inorganic gas barrier layer 130 is disposed on the first inorganic gas barrier layer 120a and covers the first inorganic gas barrier layer 120a, wherein a water vapor and oxygen transmission rate of the second inorganic gas barrier layer 130 is lower than a water vapor and oxygen transmission rate of the first inorganic gas barrier layer 120a. Favorably, the water vapor and oxygen transmission rate of the first inorganic gas barrier layer 120a in present the embodiment is ranged between 0.1 $g/m^2/day$ to 1 $g/m^2/day$ and the oxygen transmission rate of the first inorganic gas barrier layer 120a is ranged between 0.1 $cc/m^2/day \cdot atm$ to 1 $cc/m^2/day \cdot atm$, and the water vapor transmission rate of the second inorganic gas barrier layer 130 is ranged between 0.1 $g/m^2/day$ to 0.01 $g/m^2/day$ and the oxygen transmission rate of the second inorganic gas barrier layer 130 is ranged between 0.1 $cc/m^2/day \cdot atm$ to 0.01 $cc/m^2/day \cdot atm$.

More specifically, in the present embodiment, a material of the first inorganic gas barrier layer 120a is, for example, silicon nitride or silicon oxide, and a material of the second inorganic gas barrier layer 130 is substantially the same as the material of the first inorganic gas barrier layer 120a. Namely, the material of the second inorganic gas barrier layer 130 is also, for example, silicon nitride or silicon oxide. Particularly, a thickness H1 of the first inorganic gas barrier layer 120a in the present embodiment is substantially greater than a thickness H2 of the second inorganic gas barrier layer 130; more favorably, the thickness H1 of the first inorganic gas barrier layer 120a is from 100 nm to 500 nm, and the thickness H2 of the second inorganic gas barrier layer 130 is 0.1 to 0.5 times of the thickness H1 of the first inorganic gas barrier layer 120a.

Moreover, a densification of the second inorganic gas barrier layer 130 is higher than a densification of the first inorganic gas barrier layer 120a, namely, in comparative to the first inorganic gas barrier layer 120a with a greater thickness, a film quality of the second inorganic gas barrier layer 130 with a smaller thickness is denser (viz. hard). In other ward, a film quality of the first inorganic gas barrier layer 120a with the greater thickness is looser (viz. soft). In addition, a stress value of the first inorganic gas barrier layer 120a is smaller than a stress value of the second inorganic gas barrier layer 130; more favorably, the stress value of the first inorganic gas barrier layer 120a is, for example, ranged between −100 MPa to 200 MPa, and the stress value of the second inorganic gas barrier layer 130 is, for example, ranged between −300 MPa to −700 MPa. Wherein, the negative symbol "−" represents a compressive stress, and the positive symbol "+" represents a tensile stress, and are not to be repeated/reminded hereinafter.

Since the first inorganic gas barrier layer 120a and the second inorganic gas barrier layer 130, with the different water vapor and oxygen transmission rates, are sequentially disposed on the flexible base material 110 in the present embodiment, the gas barrier substrate 100a of the present embodiment, in addition to having a favorable water vapor and oxygen barrier capability, may also have a flexibility. Moreover, since the densification of the second inorganic gas barrier layer 130 with the smaller thickness is higher than the densification of the first inorganic gas barrier layer 120a with the greater thickness, in addition to an avoidance of an embrittlement due a stress concentration generated by the conventional excessively thick inorganic layer when the gas barrier substrate 100a is bended, the first inorganic gas barrier layer 120a directly in contact with the upper surface 112 of the flexible base material 110 is also not easily prone to a structural damage due to the densification thereof is lower than that of the second inorganic gas barrier layer 130 when the upper surface 112 of the flexible base material 110 has been damaged. Namely, the combination design of the first inorganic gas barrier layer 120a and the second inorganic gas barrier layer 130 may also enable the gas barrier substrate 100a to have a more favorable structural reliability. In addition, since the water vapor and oxygen transmission rate of the second inorganic gas barrier layer 130 is lower than the water vapor and oxygen transmission rate of the first inorganic gas barrier layer 120a, significant proliferations of water vapor and oxygen within the first inorganic gas barrier layer 120a and the second inorganic gas barrier layer 130 may be avoided when water vapor and oxygen are penetrated from the film layer, and thus a product reliability of the gas barrier substrate 100a is enhanced.

Figure 2:
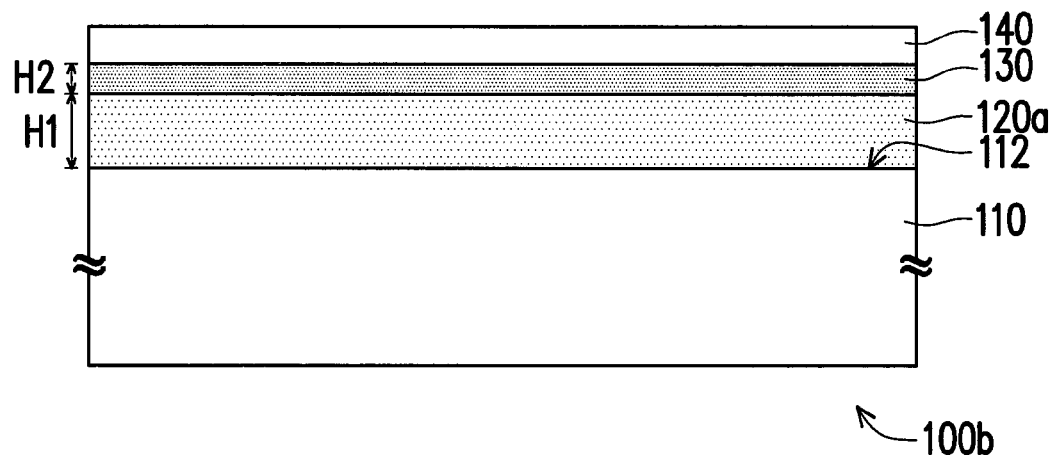
FIG. 2 is a schematic cross-sectional view illustrating a gas barrier substrate according to another embodiment.

FIG. 2 is a schematic cross-sectional view illustrating a gas barrier substrate according to another embodiment. The present embodiment adopt the element symbols and parts of the contents from the previous embodiment, wherein same symbols are being used to indicate the same or similar elements, and the description for the contents of the same technology is therefore omitted. The descriptions of the omitted parts may be referred to the previous embodiment, so that detailed descriptions thereof are not repeated. Referring to FIG. 2, a main difference between the gas barrier substrate 100b of the present embodiment and the gas barrier substrate 100a in FIG. 1 is that, the gas barrier substrate 100b of the present embodiment further includes an adhesive layer 140, wherein the adhesive layer 140 is disposed on the second inorganic gas barrier layer 130 and covers the second inorganic gas barrier layer 130. Herein, an objective of the adhesive layer 140 is to increase a bonding force between the subsequently formed active element or passive element (not shown) on the gas barrier substrate 100b and the second inorganic gas barrier layer 130 of the gas barrier substrate 100b, wherein the active element is, for example, a thin film transistor.

Figure 3:
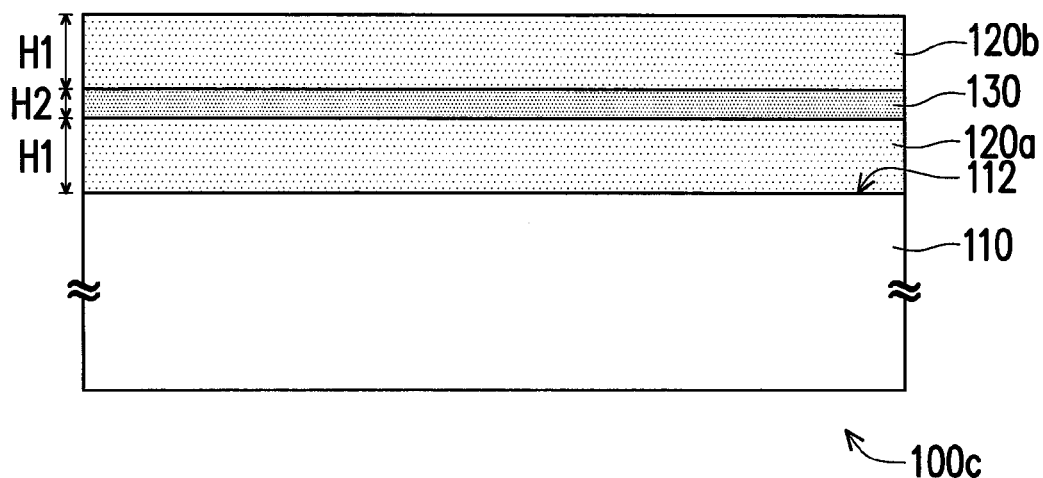
FIG. 3 is schematic cross-sectional view illustrating a gas barrier substrate according to still another embodiment.

FIG. 3 is a schematic cross-sectional view illustrating a gas barrier substrate according to still another embodiment. The present embodiment adopt the element symbols and parts of the contents from the previous embodiment, wherein same symbols are being used to indicate the same or similar elements, and the description for the contents of the same technology is therefore omitted. The descriptions of the omitted parts may be referred to the previous embodiment, so that detailed descriptions thereof are not repeated. Referring to FIG. 3, a main difference between the gas barrier substrate 100c of the present embodiment and the gas barrier substrate 100a in FIG. 1 is that, the gas barrier substrate 100c has a plurality of first inorganic gas barrier layers 120a, 120b (only two layers are illustrated in FIG. 3), and the first inorganic gas barrier layers 120a, 120b are alternatively stacked with the second inorganic gas barrier layer 130 on the flexible base material 110. As shown in FIG. 3, the second inorganic gas barrier layer 130 is sandwiched between the two first inorganic gas barrier layers 120a, 120b.

Noteworthily, the invention does not limit the amount of layer of the first inorganic gas barrier layers 120a, 120b and the second inorganic gas barrier layer 130, even though the substantial amount of layer of the first inorganic gas barrier layers 120a, 120b is two, and the substantial amount of layer of the second inorganic gas barrier layer 130 is one. However, in other embodiments (not shown), the amount of layer and the arrangement of the first inorganic gas barrier layers 120a, 120b and the second inorganic gas barrier layer 130 depend on the degree of water vapor and oxygen to be blocked, and are not limited thereto.

Figure 4:
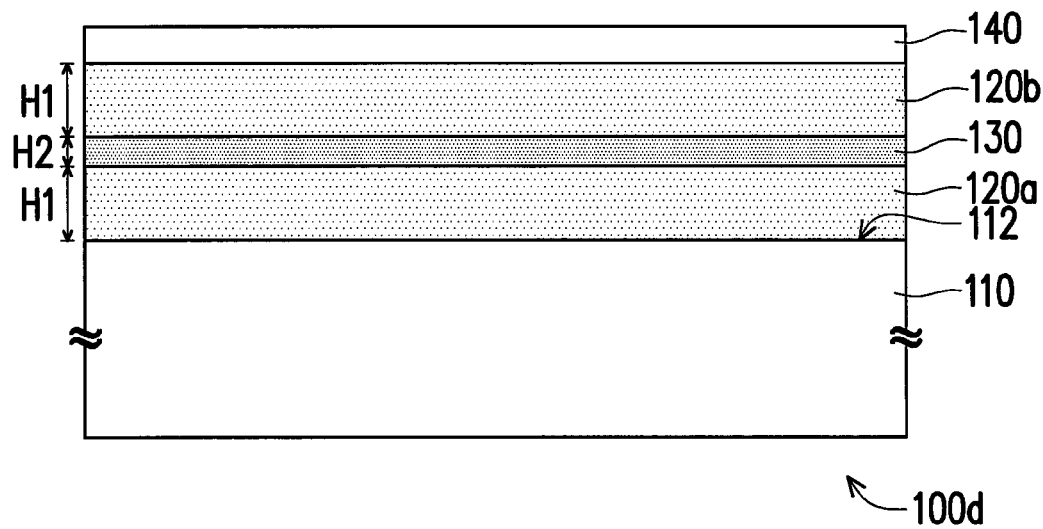
FIG. 4 is a schematic cross-sectional view illustrating a gas barrier substrate according to yet another embodiment.

FIG. 4 is a schematic cross-sectional view illustrating a gas barrier substrate 100d according to yet another embodiment. The present embodiment adopt the element symbols and parts of the contents from the previous embodiment, wherein same symbols are being used to indicate the same or similar elements, and the description for the contents of the same technology is therefore omitted. The descriptions of the omitted parts may be referred to the previous embodiment, so that detailed descriptions thereof are not repeated. Referring to FIG. 4, a main difference between the gas barrier substrate 100d of the present embodiment and the gas barrier substrate 100c in FIG. 3 is that, the gas barrier substrate 100d of the present embodiment further includes an adhesive layer 140, wherein the adhesive layer 140 is disposed on the first inorganic gas barrier layer 120b and covers the first inorganic gas barrier layer 120b. Herein, an objective of the adhesive layer 140 is to increase a bonding force between the subsequently formed active element or passive element (not shown) on the gas barrier substrate 100d and the first inorganic gas barrier layer 120b of the gas barrier substrate 100d, wherein the active element is, for example, a thin film transistor.

In summary, the first inorganic gas barrier layer and the second inorganic gas barrier layer, with different water vapor and oxygen transmission rates, are sequentially disposed on the flexible base material in the embodiments of the invention, and therefore the gas barrier substrate in the embodiments of the invention, in addition to having the favorable water vapor and oxygen barrier capability, may also have the flexibility. Moreover, since the densification of the second inorganic gas barrier layer with the smaller thickness is higher than the densification of the first inorganic gas barrier layer with the larger thickness, in addition to the avoidance of the embrittlement due the stress concentration generated by the conventional excessively thick inorganic layer when the gas barrier substrate is bended, the first inorganic gas barrier layer directly in contact with the upper surface of the flexible base material is also not easily prone to the structural damage due to the densification thereof is lower than that of the second inorganic gas barrier layer when the upper surface of the flexible base material has been damaged. Namely, the combination design of the first inorganic gas barrier layer and the second inorganic gas barrier layer may also enable the gas barrier substrate to have a more favorable structural reliability. In addition, since the water vapor and oxygen transmission rate of the second inorganic gas barrier layer is lower than the water vapor and oxygen transmission rate of the first inorganic gas barrier layer, the significant proliferations of water vapor and oxygen within the first inorganic gas barrier layer and the second inorganic gas barrier layer may be avoided when water vapor and oxygen are penetrated from the film layer, and thus the product reliability of the gas barrier substrate is enhanced. Furthermore, since the gas barrier substrate may also include the adhesive layer, the bonding force between the gas barrier substrate and the subsequently formed elements thereon may be effectively increased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A gas barrier substrate comprising:
a flexible base material having an upper surface;
a first inorganic gas barrier layer disposed on the flexible base material and covering the upper surface, wherein the first inorganic gas barrier layer directly contacts with the upper surface of the flexible base material, a material of the first inorganic gas barrier layer comprises silicon nitride or silicon oxide; and
a second inorganic gas barrier layer disposed on the first inorganic gas barrier layer and covering the first inorganic gas barrier layer, wherein a water vapor and oxygen transmission rate of the second inorganic gas barrier layer is lower than a water vapor and oxygen transmission rate of the first inorganic gas barrier layer, the material of the second inorganic gas barrier layer is the same as the material of the first inorganic gas barrier layer, wherein a densification of the second inorganic gas barrier layer is higher than a densification of the first inorganic gas barrier layer, and a thickness of the first inorganic gas barrier layer is greater than a thickness of the second inorganic gas barrier layer.

2. The gas barrier substrate as recited in claim 1, wherein the flexible base material comprises a plastic base material or a thinning glass base material.

3. The gas barrier substrate as recited in claim 1, wherein a normal stress value of the first inorganic gas barrier layer is smaller than a normal stress value of the second inorganic gas barrier layer.

4. The gas barrier substrate as recited in claim 3, wherein the normal stress value of the first inorganic gas barrier layer is ranged between −100 MPa to +200 MPa, wherein the negative symbol "−" represents a compressive stress, and the positive symbol "+" represents a tensile stress.

5. The gas barrier substrate as recited in claim 3, wherein the normal stress value of the second inorganic gas barrier layer is ranged between −300 MPa to −700 MPa, wherein the negative symbol "−" represents a compressive stress.

6. The gas barrier substrate as recited in claim 1, wherein the water vapor transmission rate of the first inorganic gas barrier layer is ranged between 0.1 g/m$^2$/day to 1 g/m$^2$/day and the oxygen transmission rate of the first inorganic gas barrier layer is ranged between 0.1 cc/m$^2$/day·atm to 1 cc/m$^2$/day·atm.

7. The gas barrier substrate as recited in claim 1, wherein the water vapor transmission rate of the second inorganic gas barrier layer is ranged between 0.1 g/m$^2$/day to 0.01 g/m$^2$/day and the oxygen transmission rate of the second inorganic gas barrier layer is ranged between 0.1 cc/m$^2$/day·atm to 0.01 cc/m$^2$/day·atm.

8. The gas barrier substrate as recited in claim 1, further comprising:
    an adhesive layer disposed on the second inorganic gas barrier layer and covering the second inorganic gas barrier layer.

9. The gas barrier substrate as recited in claim 1, wherein the first inorganic gas barrier layer is a plurality of first inorganic gas barrier layers, and the first inorganic gas barrier layers are alternatively stacked with the second inorganic gas barrier layer on the flexible base material.

\* \* \* \* \*